US009698789B2

(12) United States Patent
Hsiao et al.

(10) Patent No.: US 9,698,789 B2
(45) Date of Patent: Jul. 4, 2017

(54) INTEGRATED CIRCUIT

(71) Applicant: Novatek Microelectronics Corp., Hsinchu (TW)

(72) Inventors: Chiao-Wei Hsiao, Taichung (TW); Shyr-Chyau Luo, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 185 days.

(21) Appl. No.: 14/715,563

(22) Filed: May 18, 2015

(65) Prior Publication Data

US 2016/0072478 A1    Mar. 10, 2016

Related U.S. Application Data

(60) Provisional application No. 62/047,596, filed on Sep. 8, 2014.

(30) Foreign Application Priority Data

Feb. 12, 2015   (TW) .............................. 104104720 A

(51) Int. Cl.
  *H03H 11/28*   (2006.01)
  *H03K 19/0185*  (2006.01)
  *H02H 9/04*   (2006.01)

(52) U.S. Cl.
  CPC ..... *H03K 19/018557* (2013.01); *H02H 9/046* (2013.01); *H03H 11/28* (2013.01)

(58) Field of Classification Search
  CPC . H03H 11/28; H03K 19/018557; H02H 9/046
  See application file for complete search history.

(56) References Cited

U.S. PATENT DOCUMENTS

| 4,939,485 | A | * | 7/1990 | Eisenberg | ............ | H03K 17/693 |
| | | | | | | 257/277 |
| 5,430,403 | A | * | 7/1995 | Moyer | ................ | H01L 29/1087 |
| | | | | | | 257/E29.064 |
| 5,514,983 | A | * | 5/1996 | Yoshino | ............. | H03K 19/0005 |
| | | | | | | 326/30 |

(Continued)

OTHER PUBLICATIONS

"Office Action of Taiwan Counterpart Application", issued on May 23, 2016, p. 1-p. 5, in which the listed reference was cited.

(Continued)

*Primary Examiner* — Zeev V Kitov
(74) *Attorney, Agent, or Firm* — Jianq Chyun IP Office

(57) ABSTRACT

An integrated circuit is provided. The integrated circuit includes a pad, a core circuit, an impedance matching component, a first switch and a second switch. The pad is configured to transmit a communication signal. A communication terminal of the core circuit is coupled to the pad, and a power terminal of the core circuit is coupled to a system voltage rail. A first terminal of the impedance matching component is coupled to the pad. A first terminal of the first switch is coupled to the system voltage rail, and a second terminal of the first switch is coupled to a second terminal of the impedance matching component. A first terminal of the second switch is coupled to a control terminal of the first switch, and a second terminal of the second switch is coupled to the second terminal of the impedance matching component.

14 Claims, 3 Drawing Sheets

(56) References Cited

U.S. PATENT DOCUMENTS

| | | | |
|---|---|---|---|
| 6,621,680 B1 * | 9/2003 | Segervall | H01L 27/0285 |
| | | | 361/111 |
| 7,579,876 B1 | 8/2009 | Chen et al. | |
| 8,194,369 B2 | 6/2012 | Okushima | |
| 8,279,570 B2 | 10/2012 | Lin et al. | |
| 2012/0146427 A1 * | 6/2012 | Yeh | H03K 19/0005 |
| | | | 307/112 |

OTHER PUBLICATIONS

"Office Action of Taiwan Counterpart Application", issued on Jan. 29, 2016, p. 1-p. 5, in which the listed references were cited.

* cited by examiner

INTEGRATED CIRCUIT

CROSS-REFERENCE TO RELATED APPLICATION

This application claims the priority benefits of U.S. provisional application Ser. No. 62/047,596, filed on Sep. 8, 2014 and Taiwan application serial no. 104104720, filed on Feb. 12, 2015. The entirety of each of the above-mentioned patent applications is hereby incorporated by reference herein and made a part of this specification.

BACKGROUND

Technical Field

The invention relates to an integrated circuit, and particularly relates to an integrated circuit capable of preventing a signal voltage from flowing back to a system voltage rail.

Related Art

Along with development of technology, process technology of integrated circuit (IC) is accordingly improved. As known by those familiar with the IC technology, various electronic circuits can be integrated to/formed on a chip. In order to facilitate communicating (for example, exchanging data) with other external circuits/chips, a pad is configured on the chip.

For example, FIG. 1 is a block schematic diagram of an electronic system having a plurality of ICs. An IC 50 includes a core circuit 51, an impedance matching component 53 and a pad Tx0. A communication terminal of the core circuit 51 can output a data signal to a communication channel 10 through the pad Tx0. A first terminal and a second terminal of the impedance matching component 53 are respectively coupled to a system voltage rail VCC and the pad Tx0. The IC 50 can perform impedance matching to a transmitting terminal of the communication channel 10 by using the impedance matching component 53. An IC 100 includes an impedance matching component 105, a core circuit 110 and a pad Rx0. A communication terminal of the core circuit 110 can receive the data signal from the communication channel 10 through the pad Rx0. A first terminal and a second terminal of the impedance matching component 105 are respectively coupled to a system voltage rail TVCC and the pad Rx0. The IC 100 can perform impedance matching to a receiving terminal of the communication channel 10 by using the impedance matching component 105.

FIG. 2 is a schematic diagram of a backflow path when a signal voltage of the IC 100 of FIG. 1 flows back to the system voltage rail. Referring to FIG. 2, the communication terminal of the core circuit 110 and the first terminal of the impedance matching component 105 are coupled to the pad Rx0. A first terminal and a second terminal of a switch P1 are respectively coupled to the system voltage rail TVCC and a second terminal of the impedance matching component 105. Under a normal operation mode, based on a turn-on state of the switch P1, the impedance matching component 105 can selectively provide a resistance value to the pad Rx0. Therefore, the IC 100 can perform impedance matching to the receiving terminal of the communication channel 10 by using the impedance matching component 105.

When the IC 100 enters a power-off mode (a power-saving mode), a voltage source (not shown) stops supplying power to the system voltage rail TVCC of the IC 100, so as to save a power consumption of the core circuit 110. However, during the period that the IC 100 enters the power-off mode, the IC 50 probably transmits a communication signal to other ICs (not shown) by using the communication channel 10, such that a voltage signal is appeared on the pad Rx0 of the IC 100. During the period that the IC 100 enters the power-off mode, a control signal ZB of the switch P1 probably has an uncertain state (for example, a floating state) or a grounding state, such that the switch P1 cannot be completely turned off (it is assumed that the switch P1 is a P-channel metal oxide semiconductor (PMOS) transistor). Therefore, when a high level (for example, 3.3 V) voltage signal is appeared on the pad Rx0, the voltage signal can flow back to the system voltage rail TVCC through the impedance matching component 105 and the switch P1. The backflow path is shown by an arrow of FIG. 2. The voltage signal flowing back to the system voltage rail TVCC probably causes a wrong operation of the core circuit 110.

FIG. 3 is a schematic diagram of another backflow path when a signal voltage of the IC 100 of FIG. 1 flows back to the system voltage rail. It is assumed that the switch P1 is a PMOS transistor, so that a junction between a second terminal (a drain) of the switch P1 and a body (or bulk) of the switch P1 forms a parasitic diode D. The body of the switch P1 is coupled to the system voltage rail TVCC. During the period that the IC 100 enters the power-off mode, when a high level (for example, 3.3 V) voltage signal is appeared on the pad Rx0, the voltage signal can flow back to the system voltage rail TVCC through the impedance matching component 105 and the parasitic diode D of the switch P1. The backflow path is shown by an arrow of FIG. 3. Therefore, the voltage signal backflow phenomenon may cause a voltage increase of the system voltage rail TVCC, and accordingly causes a wrong operation of the core circuit 110.

SUMMARY

The invention is directed to an integrated circuit, which prevents a communication signal of a pad from flowing back to a system voltage rail.

The invention provides an integrated circuit including a pad, a core circuit, an impedance matching component, a first switch and a second switch. The pad is configured to transmit a communication signal. A communication terminal of the core circuit is coupled to the pad, and a power terminal of the core circuit is coupled to a system voltage rail. A first terminal of the impedance matching component is coupled to the pad. A first terminal of the first switch is coupled to the system voltage rail, and a second terminal of the first switch is coupled to a second terminal of the impedance matching component. A first terminal of the second switch is coupled to a control terminal of the first switch, and a second terminal of the second switch is coupled to the second terminal of the impedance matching component.

In summary, the embodiments of the invention provides an integrated circuit. During a period that the system voltage rail is not supplied with power, the control terminal of the first switch is coupled to the second terminal of the impedance matching component. Therefore, when the communication signal is appeared on the pad, the first switch can prevent the communication system of the pad from flowing back to the system voltage rail.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
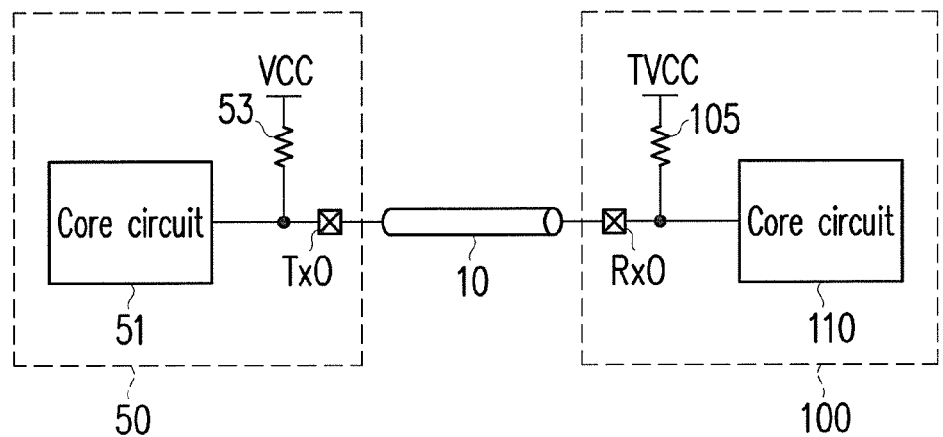
FIG. 1 is a block schematic diagram of an electronic system having a plurality of integrated circuits (ICs).
Figure 2:
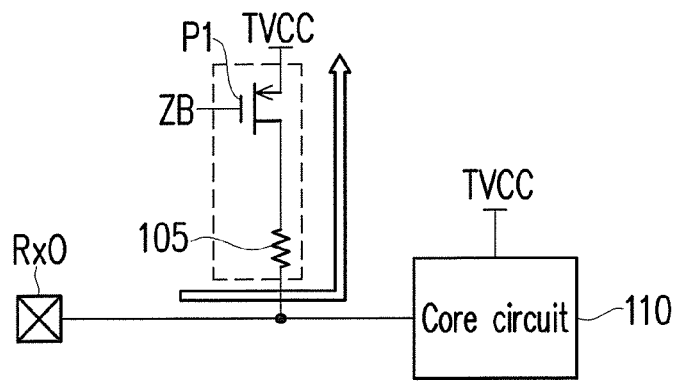
FIG. 2 is a schematic diagram of a backflow path when a signal voltage of the IC of FIG. 1 flows back to a system voltage rail.
Figure 3:
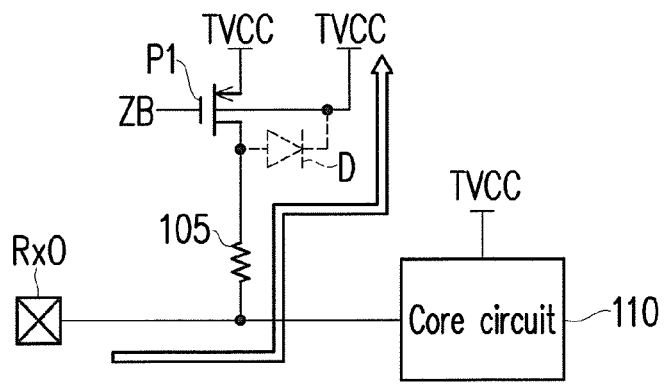
FIG. 3 is a schematic diagram of another backflow path when a signal voltage of the IC of FIG. 1 flows back to a system voltage rail.

Reference will now be made in detail to the present preferred embodiments of the invention, examples of which are illustrated in the accompanying drawings. Wherever possible, the same reference numbers are used in the drawings and the description to refer to the same or like parts.

Figure 4:
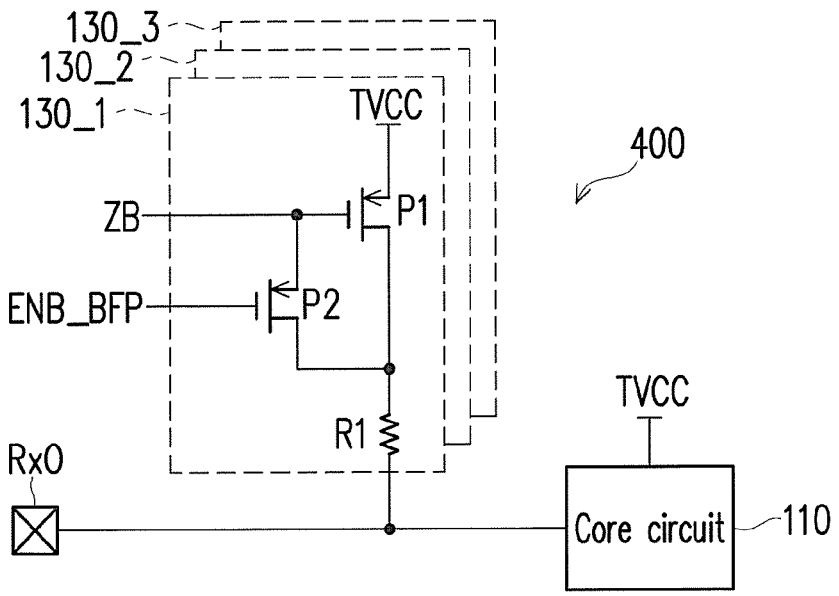
FIG. 4 is a schematic diagram of a IC capable of preventing backflow of a power current according to a first embodiment of the invention.

FIG. 4 is a schematic diagram of an integrated circuit (IC) capable of preventing backflow of a power current according to a first embodiment of the invention. Referring to FIG. 4, the IC 400 includes a pad Rx0, a core circuit 110 and one or a plurality of control circuits (for example, control circuits 130_1, 13_2, 130_3 shown in FIG. 4). A power terminal of the core circuit 110 is coupled to a system voltage rail TVCC. When the IC 400 is operated in a normal operation mode, a system voltage source (not shown) can supply power to the power terminal of the core circuit 110 through the system voltage rail TVCC. When the IC 400 enters a power-off mode (a power-saving mode), the system voltage source (not shown) stops supplying power to the system voltage rail TVCC, so as to save the power consumption of the core circuit 110.

A communication terminal of the core circuit 110 is coupled to the pad Rx0. The pad Rx0 is configured to transmit a communication signal. For example (but not limited thereto), the communication terminal of the core circuit 110 can receive the communication signal come from an external communication channel through the pad Rx0, and/or outputs the communication signal of the core circuit 110 to the external communication channel through the pad Rx0.

In the present embodiment, for clarity's sake, only the control circuits 130_1, 130_2 and 130_3 are illustrated in FIG. 4. However, in other embodiments, the number of the control circuits is not limited thereto. The control circuit 130_1 is taken as an example for description, and descriptions of the other control circuits 130_2 and 130_3 can be deduced by referring to related description of the control circuit 130_1.

The control circuit 130_1 includes an impedance matching component R1, a first switch P1 and a second switch P2. A first terminal of the impedance matching component R1 is coupled to the pad Rx0. It is assumed that the first switch P1 and the second switch P2 are all P-channel metal oxide semiconductor (PMOS) transistors, though the invention is not limited thereto. A first terminal (for example, a source) of the first switch P1 is coupled to the system voltage rail TVCC. A second terminal (for example, a drain) of the first switch P1 is coupled to a second terminal of the impedance matching component R1. A first terminal (for example, a source) of the second switch P2 is coupled to a control terminal (for example, a gate) of the first switch P1. A second terminal (for example, a drain) of the second switch P2 is coupled to the second terminal of the impedance matching component R1. A control terminal (for example, a gate) of the second switch P2 is configured to receive a control signal ENB_BFP. The control signal ENB_BFP can be any signal in response to a voltage of the system voltage rail TVCC. For example (but not limited thereto), in some embodiments, the system voltage rail TVCC can be coupled to the control terminal of the second switch P2 for providing the control signal ENB_BFP.

Under the normal operation mode, the control signal ENB_BFP can keep turning off the second switch P2. A control signal ZB can control a conduction state of the first switch P1, such that the impedance matching component 105 of the control circuits 130_1, 130_2 and 130_3 can selectively provide a resistance value to the pad Rx0. Therefore, the IC 400 can adjust impedance matching values of the control circuits 130_1, 130_2 and 130_2 by using the control signal ZB, so as to perform impedance matching to the external communication channel connected to the pad Rx0.

When the IC 400 enters the power-off mode to stop supplying power to the system voltage rail TVCC, the first switch P1 and the second switch P2 can prevent the communication signal of the pad Rx0 from flowing back to the system voltage rail TVCC. To be specific, in case that the power is off, the second control signal ENB_BFP has a low level (for example, 0 V), such that the second switch P2 in FIG. 4 is turned on. When the communication signal of the pad Rx0 flows back to the impedance matching component R1, the high voltage level (for example, 3.3 V) of the pad Rx0 is transmitted to the control terminal of the first switch P1 through the second switch P2 to turn off the first switch P1. The turned-off first switch P1 can prevent the communication signal of the pad Rx0 from flowing back to the system voltage rail TVCC.

Figure 5:
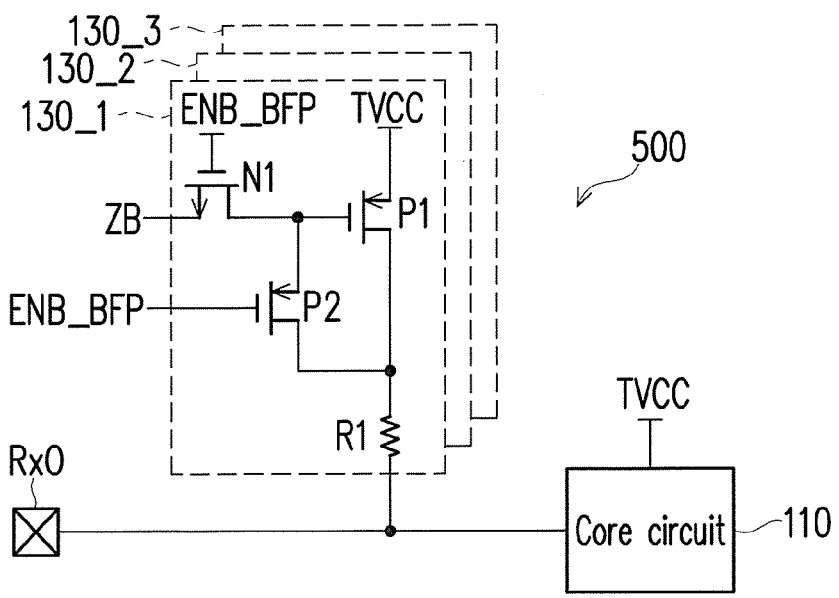
FIG. 5 is a schematic diagram of a control circuit capable of preventing backflow of a power current according to a second embodiment of the invention.

FIG. 5 is a schematic diagram of a control circuit capable of preventing backflow of a power current according to a second embodiment of the invention. Referring to FIG. 5, the IC 500 includes the pad Rx0, the core circuit 110 and one or a plurality of control circuits (for example, the control circuits 130_1, 130_2, 130_3 shown in FIG. 5). Description of the other control circuits 130_2 and 130_3 may refer to related description of the control circuit 130_1. The control circuit 130_1 of the IC 500 includes the impedance matching component R1, the first switch P1, the second switch P2 and a third switch N1. The IC 500, the control circuit 130_1, the impedance matching component R1, the first switch P1 and the second switch P2 shown in FIG. 5 may refer to related descriptions of the IC 400, the control circuit 130_1, the impedance matching component R1, the first switch P1 and the second switch P2 shown in FIG. 4, and details thereof are not repeated.

It is assumed that the third switch N1 is an N-channel metal oxide semiconductor (NMOS) transistor, though the invention is not limited thereto. In the present embodiment, a first terminal (for example, a source) of the third switch Ni can receive a control signal ZB provided by a front-end circuit (not shown). A second terminal (for example, a drain) of the third switch N1 is coupled to the control terminal of the first switch P1. A control terminal (for example, a gate) of the third switch N1 is controlled by the control signal ENB_BFP. The control signal ENB_BFP can be any signal in response to a voltage of the system voltage rail TVCC. For example (but not limited thereto), in some embodiments, the system voltage rail TVCC can be coupled to the control terminal of the second switch P2 and the control terminal of the third switch N1 for providing the control signal ENB_BFP. When the second switch P2 is turned on, the third switch N1 is turned off, and when the third switch N1 is turned on, the second switch P2 is turned off To be specific, under the normal operation mode, the control signal ENB_BFP can keep turning off the second switch P2, such that the third switch Ni is kept being turned on. The control signal ZB controls a conduction state of the first switch P1. Therefore, the IC 500 can adjust impedance matching values of the control circuits 130_1, 130_2 and 130_2 by using the control signal ZB, so as to perform impedance matching to the external communication channel connected to the pad Rx0.

When the IC 500 enters the power-off mode to stop supplying power to the system voltage rail TVCC, the control signal ENB_BFP with a low level (for example, 0 V) can keep turning on the second switch P2, such that the third switch N1 is kept being turned off When the communication signal of the pad Rx0 flows back to the impedance matching component R1, the high voltage level (for example, 3.3 V) of the pad Rx0 is transmitted to the control terminal of the first switch P1 through the second switch P2 to turn off the first switch P1. Therefore, the first switch P1 and the second switch P2 can prevent the communication signal of the pad Rx0 from flowing back to the system voltage rail TVCC. Besides, the turned-off third switch N1 can prevent the communication signal of the pad Rx0 from flowing back to the front-end circuit (not shown) that provides the control signal ZB.

Figure 6:
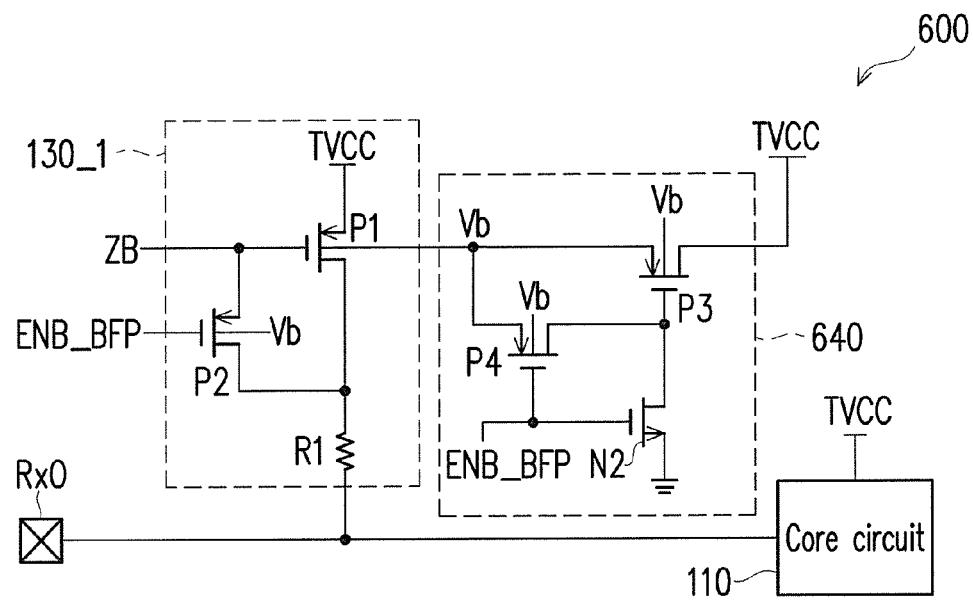
FIG. 6 is a schematic diagram of a control circuit capable of preventing backflow of a power current according to a third embodiment of the invention.

FIG. 6 is a schematic diagram of a control circuit capable of preventing backflow of a power current according to a third embodiment of the invention. Referring to FIG. 6, the IC 600 includes the pad Rx0, the core circuit 110 and one or a plurality of control circuits (for example, the control circuit 130_1 shown in FIG. 6). Description of the other control circuits may refer to related description of the control circuit 130_1. The control circuit 130_1 of the IC 600 includes the impedance matching component R1, the first switch P1 and the second switch P2. The IC 600, the control circuit 130_1, the impedance matching component R1, the first switch P1 and the second switch P2 shown in FIG. 6 may refer to related descriptions of the IC 400, the control circuit 130_1, the impedance matching component R1, the first switch P1 and the second switch P2 shown in FIG. 4, and details thereof are not repeated.

In the embodiment of FIG. 6, the IC 600 further includes a body switching circuit 640. A first terminal of the body switching circuit 640 is coupled to a body of the first switch P1, and a second terminal of the body switching circuit 640 is coupled to the system voltage rail TVCC. When the IC 600 is operated in the normal operation mode, the body switching circuit 640 is turned on, and the system voltage of the system voltage rail TVCC can be transmitted to the body of the first switch P1. When the IC 600 is operated in the power-off mode (the power-saving mode), the body switching circuit 640 is turned off, such that the body switching circuit 640 can prevent the communication signal of the pad Rx0 from flowing back to the system voltage rail TVCC through the body of the switch P1.

In the embodiment of FIG. 6, the body switching circuit 640 includes a fourth switch P3, a fifth switch P4 and a sixth switch N2. It is assumed that the fourth switch P3, the fifth switch P4 are all PMOS transistors, and the sixth switch N2 is an NMOS transistor, though the invention is not limited thereto. A first terminal (for example, a source) of the fourth switch P3 is coupled to a node Vb, and the node Vb is coupled to the body of the first switch P1. A second terminal (for example, a drain) of the fourth switch P3 is coupled to the system voltage rail TVCC. A body of the fourth switch P3 is coupled to the node Vb. A first terminal (for example, a source) of the fifth switch P4 is coupled to the body of the first switch P1. A second terminal (for example, a drain) of the fifth switch P4 is coupled to a control terminal (for example, a gate) of the fourth switch P3. A body of the fifth switch P4 is coupled to the node Vb. A first terminal (for example, a source) of the sixth switch N2 is coupled to a ground voltage rail GND. A second terminal (for example, a drain) of the sixth switch N2 is coupled to the control terminal (for example, the gate) of the fourth switch P3.

A control terminal (for example, a gate) of the fifth switch P4 and a control terminal (for example, a gate) of the sixth switch N2 are controlled by the control signal ENB_BFP. The control signal ENB_BFP can by any signal in response to the voltage of the system voltage rail TVCC. For example (but not limited thereto), in some embodiments, the system voltage rail TVCC can be coupled to the control terminal of the fifth switch P4 and the control terminal of the sixth switch N2 for providing the control signal ENB_BFP. When the fifth switch P4 is turned on, the sixth switch N2 is turned off, and when the sixth switch N2 is turned on, the fifth switch P4 is turned off Under the normal operation mode, the control signal ENB_BFP can keep turning off the fifth switch P4, such that the fourth switch P3 and the sixth switch N2 are kept being turned on. Therefore, the system voltage of the system voltage rail TVCC can be transmitted to the body of the first switch P1, the body of the second switch P2, the body of the fourth switch P3 and the body of the fifth switch P4 through the fourth switch P3 and the node Vb.

When the IC 600 enters the power-off mode to stop supplying power to the system voltage rail TVCC, the control signal ENB_BFP with a low level (for example, 0 V) can keep turning on the fifth switch P4, such that the sixth switch N2 is kept being turned off When the communication signal of the pad Rx0 flows back to the impedance matching component R1, the high voltage level (for example, 3.3 V) of the pad Rx0 is transmitted to the control terminal of the fourth switch P3 through the body of the first switch P1 and the fifth switch P4 to turn off the fourth switch P3. Therefore, the fourth switch P3 can prevent the communication signal of the pad Rx0 from flowing back to the system voltage rail TVCC through the body of the first switch P1.

Figure 7:
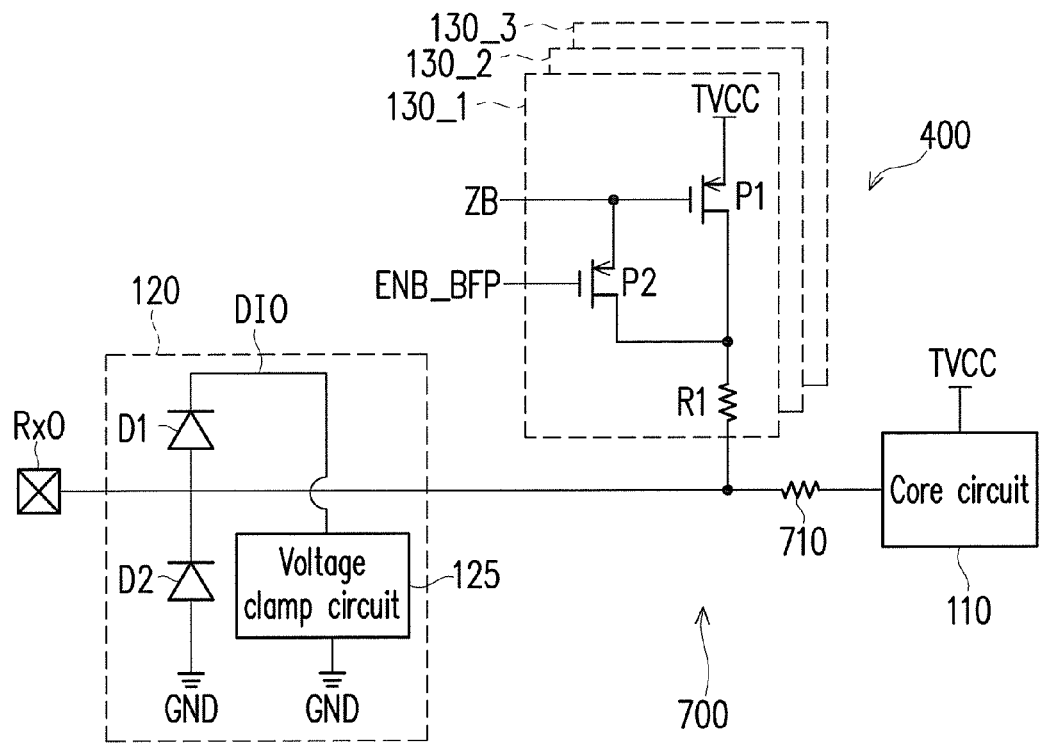
FIG. 7 is a schematic diagram of a control circuit capable of preventing backflow of a power current according to a fourth embodiment of the invention.

FIG. 7 is a schematic diagram of a control circuit capable of preventing backflow of a power current according to a fourth embodiment of the invention. Referring to FIG. 7, the IC 700 includes the pad Rx0, the core circuit 110, an electrostatic discharge (ESD) protection circuit 120, a current-limiting resistor 710 and one or a plurality of control circuits (for example, the control circuits 130_1, 130_2 and 130_3 shown in FIG. 7). The control circuit 130_1 of the IC 700 includes the impedance matching component R1, the first switch P1 and the second switch P2. Description of the other control circuits 130_2 and 130_3 may refer to related description of the control circuit 130_1. The IC 700, the control circuit 130_1, the impedance matching component R1, the first switch P1 and the second switch P2 shown in FIG. 7 may refer to related descriptions of the IC 400, the control circuit 130_1, the impedance matching component R1, the first switch P1 and the second switch P2 shown in FIG. 4, and details thereof are not repeated.

The current-limiting resistor 710 is disposed in an electrical path between the first terminal of the impedance matching component R1 and the communication terminal of the core circuit 110. The current-limiting resistor 710 can block/limit an ESD current from flowing into the core circuit 110 through the pad Rx0. The ESD protection circuit 120 is coupled to the pad Rx0. When the ESD is occurred, the ESD protection circuit 120 provides an ESD current path from the pad Rx0 to the ground voltage rail GND, so as to prevent the ESD current of the pad Rx0 from impacting the core circuit 110 to cause an internal damage.

In the present embodiment, the ESD protection circuit 120 includes a first diode D1, a second diode D2 and a voltage clamp circuit 125. The voltage clamp circuit 125 can also be referred to as an ESD clamp circuit. A first terminal of the voltage clamp circuit 125 is connected to a cathode of the first diode D1. A second terminal of the voltage clamp circuit 125 is connected to the ground voltage rail GND. When a positive ESD pulse is appeared on the pad Rx0, the positive ESD pulse is guided to the ground voltage rail GND through the first diode D1 and the voltage clamp circuit 125. When a negative ESD pulse is appeared on the pad Rx0, the negative ESD pulse is guided to the ground voltage rail GND through the second diode D2. implementations of the first diode D1, the second diode D2 and the voltage clamp circuit 125 are not limited by the invention. For example (but not limited thereto), the first diode D1, the second diode D2 and the voltage clamp circuit 125 can be the known ESD diodes and known ESD clamp circuit.

It should be noticed that when the IC 700 enters the power-off mode to stop supplying power to the system voltage rail TVCC, in order to prevent the communication signal of the pad Rx0 from flowing back to the system voltage rail TVCC through the first diode D1, the cathode of the first diode D1 shown in FIG. 7 is not coupled to the system voltage rail TVCC, but is coupled to an "independent" ESD rail DIO. During the normal operation period of the IC 700, the ESD rail DIO is not used (for example, the ESD rail DIO is not used for transmitting the communication signal or a system power). When the positive ESD pulse is appeared on the pad Rx0, the positive ESD pulse is guided to the ground voltage rail GND through the first diode D1, the ESD rail DIO and the voltage clamp circuit 125.

In summary, the invention provides an IC, which has an ESD protection function, and is capable of preventing the communication signal of the pad Rx0 from flowing back to the system voltage rail TVCC. When the IC 700 enters the power-off mode to stop supplying power to the system voltage rail TVCC, the control signal ENB_BFP with a low level (for example, 0 V) can keep turning on the second switch P2. When the communication signal of the pad Rx0 flows back to the impedance matching component R1, the high voltage level (for example, 3.3 V) of the pad Rx0 is transmitted to the control terminal of the first switch P1 through the impedance matching component R1 and the second switch P2 to turn off the first switch P1. On the other hand, the cathode of the first diode D1 is not coupled to the system voltage rail TVCC. Therefore, the IC 700 can prevent the communication signal of the pad Rx0 from flowing back to the system voltage rail TVCC, and a projection function of the ESD protection circuit 120 can normally function.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An integrated circuit, comprising:
   a pad, configured to transmit a communication signal;
   a core circuit, having a communication terminal coupled to the pad, and a power terminal coupled to a system voltage rail; and
   a control circuit, comprising:
   an impedance matching component, having a first terminal coupled to the pad;
   a first switch, having a first terminal coupled to the system voltage rail, and a second terminal coupled to a second terminal of the impedance matching component;
   a second switch, having a first terminal coupled to a control terminal of the first switch, and a second terminal coupled to the second terminal of the impedance matching component, and
   a third switch, having a first terminal receiving a control signal, and a second terminal coupled to the control terminal of the first switch,
   wherein the third switch is turned off when the second switch is turned on, and the second switch is turned off when the third switch is turned on.

2. The integrated circuit as claimed in claim 1, wherein the control circuit further comprises:
   a body switching circuit, having a first terminal and a second terminal respectively coupled to a body of the first switch and the system voltage rail.

3. The integrated circuit as claimed in claim 2, wherein the body switching circuit comprises:
   a fourth switch, having a first terminal and a second terminal respectively coupled to the body of the first switch and the system voltage rail;
   a fifth switch, having a first terminal coupled to the body of the first switch, and a second terminal coupled to a control terminal of the fourth switch; and
   a sixth switch, having a first terminal coupled to a ground voltage rail, and a second terminal coupled to the control terminal of the fourth switch.

4. The integrated circuit as claimed in claim 3, wherein the sixth switch is turned off when the fifth switch is turned on, and the fifth switch is turned off when the sixth switch is turned on.

5. The integrated circuit as claimed in claim 1, further comprising:
   an electrostatic discharge protection circuit, coupled to the pad.

6. The integrated circuit as claimed in claim 5, wherein the electrostatic discharge protection circuit comprises:
   a first diode, having an anode coupled to the pad;
   a second diode, having a cathode coupled to the pad, and an anode coupled to a ground voltage rail; and a voltage clamp circuit, having a first terminal coupled to a cathode of the first diode, and a second terminal coupled to the ground voltage rail.

7. The integrated circuit as claimed in claim 1, further comprising:
a current-limiting resistor, disposed in an electrical path between the first terminal of the impedance matching component and the communication terminal of the core circuit.

8. An integrated circuit, comprising:
a core circuit, coupled to a pad, and a system voltage rail; and
a control circuit, comprising:
a first current path, coupled between the system voltage rail and the pad, and comprising a first control terminal;
a first group of switches, having one or more terminals coupled to the first control terminal of the first current path, and configured to adjust a voltage of the first control terminal in response to a first control signal so as to prevent backflow of a first power current through the first current path;
a second current path, coupled between the system voltage rail and the first current path, and comprising a second control terminal; and
a second group of switches, having one or more terminals coupled to the second control terminal of the second current path, and configured to adjust a voltage of the second control terminal in response to the first control signal so as to prevent backflow of a second power current through the second current path.

9. The integrated circuit as claimed in claim 8, further comprising an impedance matching component, coupled to the pad and the first current path.

10. The integrated circuit as claimed in claim 8, wherein the first current path comprises a MOS transistor having a gate acting as the first control terminal and having a first source/drain terminal coupled to the system voltage rail and a second source/drain terminal coupled to the pad.

11. The integrated circuit as claimed in claim 8, wherein the first group of switches comprises:
a first switch coupled between the pad and the first control terminal and having a terminal coupled to the first control signal; and
a second switch coupled between a second control signal and the first control terminal and having a terminal coupled to the first control signal.

12. The integrated circuit as claimed in claim 8, wherein the second current path comprises a MOS transistor having a gate acting as the second control terminal and having a first source/drain terminal coupled to the system voltage rail and a second source/drain terminal coupled to the first current path.

13. The integrated circuit as claimed in claim 8, wherein the second group of switches comprises:
a first switch coupled between a reference voltage and the second control terminal, and having a terminal coupled to the first control signal; and
a second switch coupled between the second control terminal and the first current path and having a terminal coupled to the first control signal.

14. An integrated circuit, comprising: a core circuit, coupled to a pad, and a system voltage rail; and a control circuit, comprising:
one or more current paths, each coupled to the system voltage rail comprising a respective control terminal;
one or more groups of switches, each having one or more terminals coupled to the respective control terminal of a corresponding one of the one or more current paths, and configured to adjust a voltage of the respective control terminal in response to a control signal so as to prevent backflow of a respective power current through the corresponding current path when the core circuit operates in a power down mode.

* * * * *